United States Patent [19]

Schaefer

[11] Patent Number: 5,293,126
[45] Date of Patent: Mar. 8, 1994

[54] LOCAL TRANSVERSE GRADIENT COIL

[75] Inventor: Daniel J. Schaefer, Waukesha, Wis.

[73] Assignee: General Electric Company, Milwaukee, Wis.

[21] Appl. No.: 973,444

[22] Filed: Nov. 9, 1992

[51] Int. Cl.⁵ .......................................... G01R 33/20
[52] U.S. Cl. ............................................... 324/318
[58] Field of Search ............... 324/300, 307, 309, 318, 324/322; 128/653.5

[56] References Cited

U.S. PATENT DOCUMENTS 4,985,678  1/1991  Gangarosa et al. ............... 324/318

Primary Examiner—Michael J. Tokar
Attorney, Agent, or Firm—Quarles & Brady

[57] ABSTRACT

A local coil assembly includes an RF coil disposed inside a cylindrical form and a pair of z-axis gradient coils wound around the outside of the cylindrical form. First and second pairs of gradient coils are mounted on opposite sides and extend radially outward from the cylindrical form. These pairs of gradient coils produce a gradient field perpendicular to the z-axis with minimal effect on the operation of the RF coil.

6 Claims, 5 Drawing Sheets

LOCAL TRANSVERSE GRADIENT COIL

BACKGROUND OF THE INVENTION

The field of the invention is magnetic resonance imaging (MRI) and, in particular, gradient coils for use with MRI systems.

In MRI, a uniform polarizing magnetic filed $B_o$ is applied to an imaged object along the z-axis of a Cartesian coordinate system, the origin of which is approximately centered within the imaged object. The effect of the magnetic field $B_o$ is to align the object's nuclear spins along the z-axis.

In response to a radio frequency (RF) excitation signal of the proper frequency, oriented within the x-y plane, the nuclei precess about the z-axis at their Larmor frequencies according to the following equation:

$$F = \gamma B_o \qquad (1)$$

where F is the Larmor frequency, $\gamma$ is the gyromagnetic ratio which is constant and a property of the particular nuclei, and $B_o$ is the polarizing field strength.

Water, because of its relative abundance in biological tissue and the properties of its nuclei, in of principle concern in such imaging. The value of the gyromagnetic ratio $\gamma$ for water is 4.26 kHz/gauss and therefore, in a 1.5 Tesla polarizing magnetic field $B_o$, the resonant or Larmor frequency is approximately 63.9 MHz.

In a typical imaging sequence, the RF excitation signal is centered at the Larmor frequency F and applied to the imaged object at the same time as a magnetic field gradient $G_z$ is applied. The gradient $G_z$ varies the strength of the magnetic field $B_o$ along the z-axis and, therefore, causes only the nuclei in a single slice through the object along an x-y plane to have the resonant frequency F and to be excited into resonance.

After the excitation of the nuclei in this slice, similar magnetic field gradients are applied along the x and y axes. The gradient along the x-axis, $G_x$, causes the nuclei to precess at different frequencies, depending on their position along the x-axis, that is, $G_x$ spatially encodes the processing nuclei by frequency. The y-axis gradient, $G_y$, is incremented through a series of values and encodes y position into the rate of change of phase of the precessing nuclei as a function of gradient amplitude, a process typically referred to as phase encoding.

A weak nuclear magnetic resonance signal generated by the precessing nuclei may be sensed by the RF antenna "coil" and recorded as an NMR signal. Typically, the NMR signal is detected along two perpendicular axes to produce a quadrature signal having a real and an "imaginary" part. From this quadrature NMR signal, a slice of image may be derived according to well-known reconstruction techniques. A basic overview NMR image reconstruction is contained in the book "Magnetic Resonance Imaging, Principles and Applications" by D. N. Kean and M. A. Smith.

The polarizing magnetic field $B_o$, for field strengths above approximately 0.2 Tesla, is typically produced by superconducting coils arranged along the z-axis and around a bore tube. The field is adjusted to be highly homogeneous in a spherical volume centered within the bore tube.

Gradient coils, for impressing the magnetic gradients, $G_x$, $G_y$ and $G_z$, on the uniform magnetic field $B_o$, are ordinarily affixed to the bore tube. Strong repulsive forces are generated between each gradient coil and, therefore, the gradient coils are typically firmly attached to the bore tube and restrained by laminated epoxy and glass fiber. The gradient coil restraints resist such forces and reduce the acoustic noise generated by the flexing of the gradient windings.

An RF coil is also affixed to the bore tube and may be a cage like antenna having end-loops interconnected by a series of linear segments spaced circumferential about the end-loop. Such coils are taught, for example, in U.S. Pat. Nos. 4,694,255, 4,692,705 and 4,680,548, and are incorporated herein by reference.

The polarizing, gradient, and the RF coils are positioned on the outside of the bore tube so as not to interfere with placement of the patient in the bore tube for scanning. For maximum flexibility in medical applications, the bore tube is made large enough to permit the patient's entire body to be positioned within the bore tube taking into account expected variation in body dimensions between patients.

In order to practice certain pulse sequences it is desirable to greatly increase the strength and speed of the gradients $G_x$, $G_y$ and $G_z$. Gradient "speed" is the time required to change the magnitude of the gradient field between particular values. For most imaging techniques, higher gradient strength and response speed will decrease the time needed to acquire the NMR data required for an image. In particular, faster gradients reduce the time required to complete the MRI gradient pulse sequences and stronger gradients decrease the time needed to sample the received NMR signal by increasing the bandwidth of the NMR signal. Particularly in echo-planar imaging, where a single excitation produces a series of echoes, which are gradient encoded to generate image data, high gradient strength and speed is necessary to realize the full potential of rapid acquisition promised by this technique. Stronger gradients also increase the spatial resolution of the imaging process permitting smaller voxels to be discerned.

Also, for a number of specialized imaging techniques, higher gradient strength increases the "contrast" of the acquired data. This is true in flow and diffusion studies where the received NMR signal indicates the rate of flow of blood or other material, and in spectrographic studies, to measure the chemical shift between tissues caused by differing values of $\gamma$.

Both the response speed and the strength of the gradient field may be increased by increasing the power applied to the gradient coils. For a given geometry of gradient coil having a fixed inductance, the response time of the gradient coil, i.e., the amount of time required for the coil to reach a particular field strength, will depend on the applied current, and hence, on the available power. The power applied to the gradient coil is typically provided by dedicated gradient amplifiers. Therefore, increasing the maximum power that may be applied to a gradient coil is accomplished by increasing the power of each amplifier or by stacking additional amplifiers together.

There are practical limits to increasing gradient speed and strength by increasing the power applied to the gradient coil. The first limit is the cost of the gradient amplifiers. A factor of 5 to 50 increase in gradient power, over that required for conventional imaging, may be required, and the cost of the amplifiers needed to produce this power is prohibitive. The second limit is the power dissipation of the gradient coil. High gradient fields may require currents as high as 1000 amperes and such current levels create significant coil cooling problems. Cooling techniques such as circulating refrigerant among the gradient coil windings may be used, but add significantly to the cost of the MRI system.

In co-pending U.S. patent application Ser. No. 07/743,550, filed on Aug. 12, 1991 now U.S. Pat. No. 5,185,576, and entitled "Local Gradient Coil" gradient speed is increased without a corresponding increase in gradient power by decreasing the size of a gradient coil. The local gradient coil described therein provides one axis of the gradient field without undue interference with the RF field produced by an associated local and, without unduly interfering with patient access and comfort. In many pulse sequences, however, it is desirable to provide two orthogonal high speed gradient magnetic fields.

SUMMARY OF THE INVENTION

The present invention relates to a local gradient coil that produces a magnetic field component parallel to the polarizing magnetic field of the NMR system which varies linearly in a direction orthogonal to the polarizing field. More specifically, the local gradient coil includes a cylindrical form which is sized to encircle the subject to be imaged and which has a central axis directed along the polarizing magnetic field, a first pair of gradient coils mounted to one side of the cylindrical form and being oriented to produce a first magnetic field parallel to the polarizing magnetic field, and a second pair of gradient coils mounted to the other side of the cylindrical form and being oriented to produce a second magnetic field parallel to the polarizing magnetic field and opposite in direction to the first magnetic field.

A general object of the invention is to produce a magnetic field gradient orthogonal to the polarizing magnetic field using local coils. The cylindrical form is sized to fit around the particular anatomy to be imaged and the gradient coil pairs are mounted to the opposite sides thereof in close proximity to the subject. The strength of the fields they produce varies linearly from one polarity adjacent one pair of gradient coils to the opposite polarity adjacent the other pair of gradient coils on the other side of the patient.

Another aspect of the invention is to provide a local gradient coil structure which does not interfere with the operation of a local RF coil. A bird cage type RF local coil is disposed in the cylindrical form with its straight elements directed along and disposed around the central axis. The gradient coils are located outside the local RF coil and they conduct current in a direction substantially orthogonal to the RF coil's straight elements.

A number of problems arise in reducing the size of gradient coils and increasing the strength of the fields generated by these coils including: electrical interference between the gradient coils and the RF coil, constraints in the coil geometry imposed by patient anatomy, increased acoustic noise from the smaller and lighter coil forms, and problems of patient comfort associated with smaller coil enclosures. The present invention addresses these problems.

Specifically, a cylindrical coil form is constructed within the bore, the coil form defining a local imaging volume near the patient and including a surface for holding the patient in a predetermined position with respect to the coil form. Gradient coils are affixed to the coil form for imposing a substantially linear magnetic gradient along an axis normal to the polarizing field and within the local imaging volume, and an RF coil is affixed to the coil form for generating a radio frequency magnetic field within the local imaging volume.

It is one object of the invention to reduce the electrical interference between the local RF coil and the local gradient coil. The conductors of the gradient coil can change the tuning of the RF coil and distort the RF field causing shading artifacts in the constructed image and possible increased RF power deposition to some volumes of the patient. Additionally, interaction between these coils reduces the Q of the RF coil and can destroy its quadrature sensitivity, thereby reducing the signal to noise ratio. Placing the gradient coils on the outside of the RF coil removes them from the region of highest RF field strength and thus reduces their effect on the RF field. Placing the gradient coils outside the RF coil also permits the use of an interposed RF shield (if desired) to prevent interaction between the RF coil and gradient coils. And finally, the orientation of the gradient coils provides minimal coupling to the RF coil.

It is another object of the invention to provide increased patient comfort, specifically, when employing the local gradient coils in head imaging. The gradient coils of the present invention permit a view port to be cut in the coil form without interfering with their operation.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

GENERAL DESCRIPTION OF THE INVENTION

Figure 7:
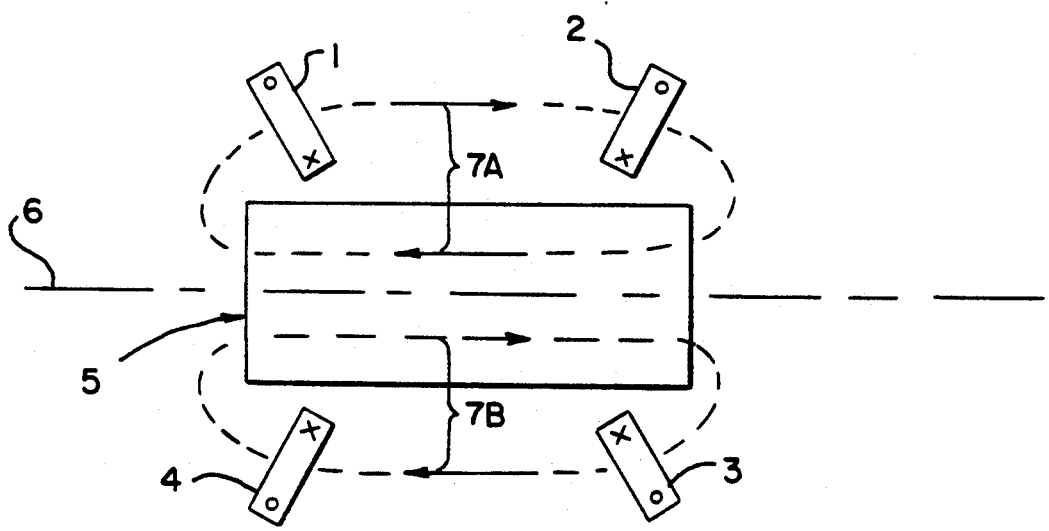
FIG. 7 is a schematic representation of the local gradient coils of the present invention.

The present invention concerns a class of solutions to the problem of providing a small gradient coil which is transparent to the RF coil and which provides a linear gradient field transverse to the polarizing field. Referring particularly to FIG. 7, a set of four "winged" gradient coils 1-4 are disposed on opposite sides of a circular cylindrical RF coil 5. The coils 1-5 are centered about an axis 6 which is oriented in the direction of the static polarizing magnetic field. Each gradient coil 1-4 has a set of inner conductors that carry current into the page as indicated by the "x" and a set of outer conductors disposed further away from the axis 6 and RF coil 5 which carry current out of the page as indicated by the "0." These conductors in the gradient coils 1-4 are substantially perpendicular to the linear conductors in the RF coil 5, and they therefore are substantially transparent to the RF coil 5.

A magnetic field indicated at 7A is produced by coils 1 and 2 and a magnetic field 7B is produced by coils 3 and 4. As one moves from the top of the imaging volume within the RF coil 5 towards the bottom, the magnetic field steadily decreases from a negative value produced by field 7A, to zero at the central axis 6 and to a positive value produced by field 7B. If the locations of the gradient coils 1-4 are judiciously selected, the magnetic fields 7A and 7B which they produce change linearly from a maximum negative value at the top of the imaging volume to a maximum positive value at the bottom of the imaging volume. The location of the inner conductors is determined by the radius of the RF coil 5 and the location of the outer conductors is limited by the whole body coil which surrounds the entire structure. The primary design variables, are the angle $\theta$ of each coil with respect to the central axis 6, and the radii from the coil center to each conductor.

A convenient approximate gradient coil design technique is to expand the field from an infinite wire orthogonal to a plane in a Taylor series expansion. Assume such an infinite wire is located at (a,b) in the complex plane. In polar coordinates, the wire is a distance $r=\sqrt{(a^2+b^2)}$ from the original at an angle, $\Theta=\text{atan}(-b/a)$, from the coil axis (z axis).

The field components at any point $W=Z+j*Y$ from a collection of m wires located at $r_i$, $\Theta_i$ and carry current $I_i$ where $i=1, \ldots, m$ are:

$$B_y = -K \, Re \sum_{i=1}^{m} \sum_{n=0}^{\infty} \left(\frac{I_i}{r_i}\right)\left[\left(\frac{W}{r_i}\right)^n \text{EXP}(-j(n+1)\theta_i)\right], \quad (1)$$

and $$B_x = K \, Im \sum_{i=1}^{m} \sum_{n=0}^{\infty} \left(\frac{I_i}{r_i}\right)\left[\left(\frac{W}{r_i}\right)^n \text{EXP}(-j(n+1)\theta_i)\right]. \quad (2)$$

Here $K=\mu/(2\pi)$, where $\mu$ is the magnetic permeability of free space and $j=\sqrt{(-1)}$. For linear gradients the objective is to make the lowest non-linear term zero. This may be accomplished by judicious selection of $\Theta_i$, $r_i$, and if a sufficient number of conductors are used, also $I_i$.

Now consider a "winged" gradient coil employing four coils as shown in FIG. 7. One conductor in each coil is located nearest to the imaging volume and carries current in the same direction into the page as indicated at "+". A second conductor in each coil runs parallel to the first set of conductors, but are more remote from the imaging volume. In the second set of conductors, current flows in the opposite direction, out of the page as indicated at "0". A magnetic field gradient is produced in the vertical direction. Taking fields pointing to the right as positive, as one moves from the top of the imaging volume to the bottom, the magnetic gradient field increases monotonically. The magnetic field gradient changes from maximally negative at the top, through zero at the center axis 6, and then becomes increasingly positive as the bottom is approached.

Let the static field, $B_0$, be along Z, the central axis. Then equation (2) is used to design linear gradient coils. Maximum linearity is obtained by placing the inner and outer conductors along lines making angles with respect to the Z axis of $\Theta_1=22.5°$ or $67.5°$, $\Theta_2=180°-\Theta_1$, $\Theta_3=180°+\Theta_1$, and $\Theta_4=\Theta_1$. Transverse gradient coils are typically to be used with a head or extremity RF coil or in other circumstances where space is a premium. Assume that the outer gradient windings correspond in the Z dimension with the edge of the RF coil. Then the 22.5° or 67.5° angles dictate that the diameter of the outer transverse "winged" coil must be either 41.4% or 241.4% of its length. However, typical RF transmit coils approach a diameter to length ratio of one to obtain an optimal balance between homogeneity and coil length. Another issue is that local gradient coils are placed within the body coil and so are constrained in diameter. The following design procedure demonstrates how these difficulties may be surmounted.

Assume that the outer and inner conductors in FIG. 7 are not on the same line from the original, i.e., they make angles (with respect to the Z axis), $\Theta_0$, and $\Theta_i$, respectively. The lowest order non-linear term in the Taylor series expansion of equation (2), where TERM=(W/$r_i$) n exp(-j(n+1)$\Theta_i$) is:

$$\text{TERM} = 4W\left[\left(\cos\left(2\frac{\theta_i}{r_i}\right)\right)-\left(\cos\left(2\frac{\theta_0}{r_0}\right)\right)\right]+ \quad (3)$$

$$4W^3\left[\left(\cos\left(4\frac{\theta_i}{r_i^3}\right)\right)-\left(\cos\left(4\frac{\Theta_0}{r_0^3}\right)\right)\right]+\ldots$$

The outer radius is $r_0$ and the inner radius is $r_i$. For optimum linearity the higher order terms must vanish. This condition is aided by the fact that $W/r_i<1$ and $W/r_0<1$. So we require that:

$$\cos\left(4\frac{\Theta_i}{r_i^3}\right) = \cos\left(4\frac{\Theta_0}{r_0^3}\right) \quad (4)$$

The first step in the coil synthesis procedure is to specify the given parameters. These include the W coordinate of the outer gradient coil (typically 0.5*L, where L=length of the associated RF coil) and the Y coordinate of the inner gradient coil, R. The value of R is typically slightly greater than the outer diameter of the associated RF coil. For maximum gradient strength, it is desirable to place $r_i$ close to the central axis and $r_0$ as distant from the central axis as possible consistent with linearity and geometrical constraints. Due to spatial limitation, it is usually possible to specify $r_0$. The remaining variables $r_i$ and $\Theta_i$ are not independent once the radius of the RF coil is specified. In fact:

$$r_i = \frac{R}{\sin(\Theta_i)}, \quad (5)$$

and $$r_0 = \frac{L}{2 \cos(\Theta_0)}. \quad (6)$$

It can be shown that equation (4) becomes:

$$\frac{((\cos(4\Theta_i))\ (\sin(\Theta_i))^3)}{R^3} = \frac{(8(\cos(4\Theta_0))\ (\cos(\Theta_0))^3)}{L^3}. \quad (7)$$

As a result, if we take the right side of equation (7) to be K, then the equation is transformed to:

$$8\ (\sin(\Theta_i))^7 - 8\ (\sin(\Theta_i))^5 + (\sin(\Theta_i))^3 K R^3. \quad (8)$$

Equation (8) may then be solved graphically for $\Theta_i$ and then $r_i$ may be calculated as $r_i = R/(\sin \Theta_i)$.

As an example, assume L=0.306 meters, $r_0$=0.286 meters, $\Theta_0$=57.64°, and R=0.181 meters. Then $\Theta_i$=64.3° and $r_i$=0.201 meters. These dimensions are appropriate for a local head gradient coil.

DETAILED DESCRIPTION OF THE PREFERRED EMBODIMENT

Figure 1:
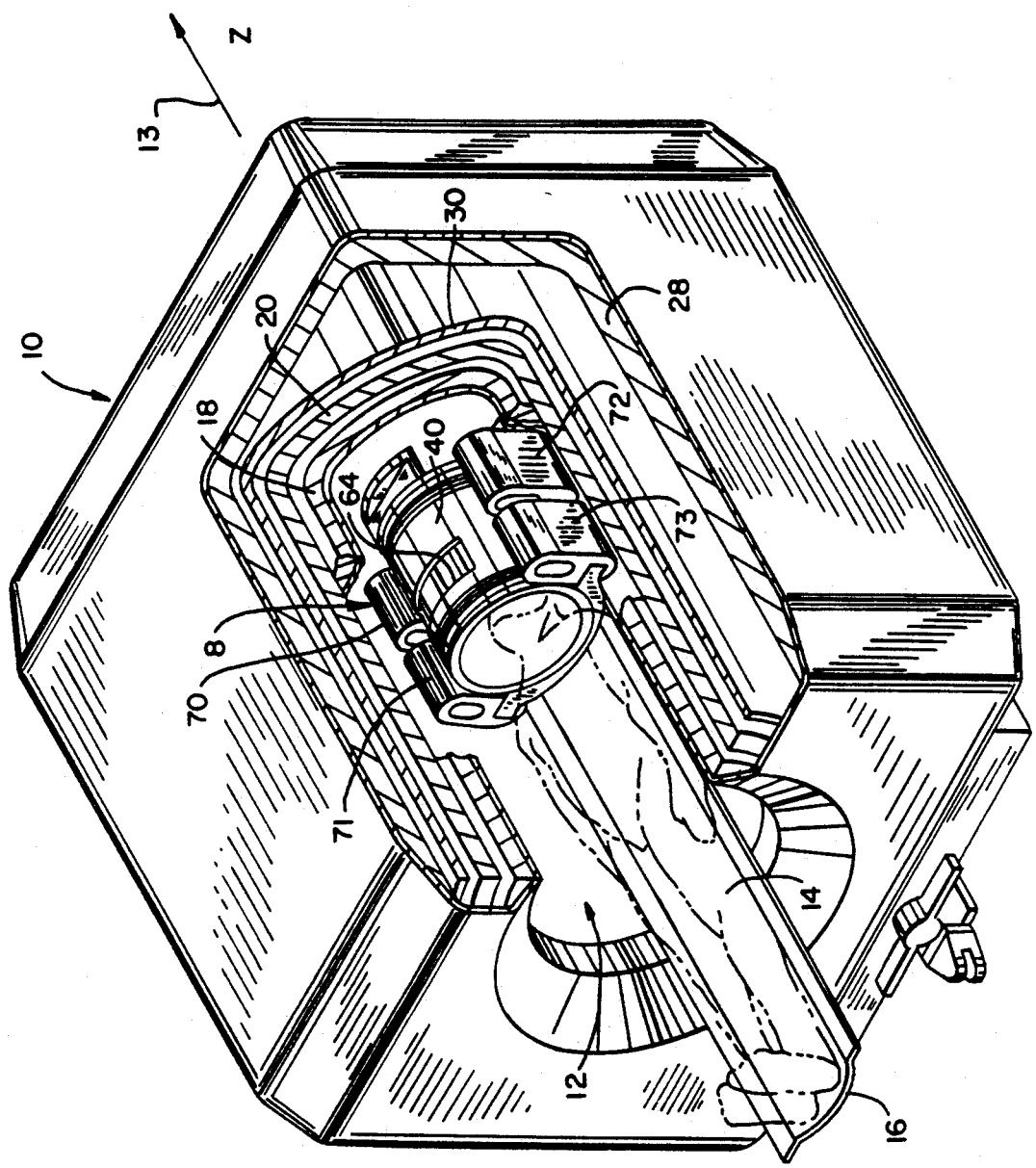
FIG. 1 is a perspective, cut-away view of an MRI magnet showing the placement of the polarizing coils, the gradient coils, and the RF coils on the bore tube and showing the placement of the local gradient and RF coil of the present invention about the head of the patient.

Referring to FIG. 1, an MRI magnet assembly has a cylindrical bore tube 12 extending along a z-axis 13 for receiving a supine patient 14 supported on a radiolucent table 16. The table 16 may move in and out of the bore tube 12 so as to position the patient 14 along the z-axis 13 within the volume of the bore tube 12.

Coaxially surrounding the bore tube 12 is an RF coil 18 for exciting the spins of the patient 14 into resonance, as has been described. Gradient coils 20 surround both the bore tube 12 and the RF coil 18 and are also co-axial with the z-axis 13, to provide x, y and z gradient fields $G_x$, $G_y$ and $G_z$ as required for MRI imaging. The gradient coils 20 are driven by gradient amplifiers (not shown). The polarizing magnetic field $B_0$, aligned with the z-axis 13, is generated by a superconducting magnet coil 28 coaxial with but outside the bore tube 12, the RF coil 18, and the gradient coils 20. The superconducting magnet coil 28 has no external power supply but operates on an initial current which continues unabated in the zero resistivity windings of the superconducting magnet coil 28.

Interposed between the superconducting magnet coil 28 and the gradient coil 20 is a set of shim coils 30 which are used to correct the homogeneity of the polarizing field $B_0$ as is understood in the art. A set of mechanical linkages and insulators (not shown) rigidly connect each of these coils 18, 20, 28 and 30 together to the bore tube 12 so as to resist such relative motions therebetween as may be generated by the interaction of their various electromagnetic fields.

The local coil assembly 8, of the present invention, is constructed about a cylindrical tube 40 sized to be received within the bore tube 12 when sitting on the table 16. The inside diameter of the bore tube 12 is approximately 22 inches whereas the inside diameter of the local coil assembly 8 is approximately 11 inches. Thus, the internal volume of the local coil assembly 8 more nearly approaches the volume of the patient's head.

The local coil assembly 8 is not directly attached to the bore tube 12 but rather is attached to the table 16 and thereby resists motion caused by the interaction of its fields with the coils 28 previously described. The table 16 may be moved along the z-axis 13 to position the local coil assembly 8 at the center of the bore tube 12, generally the position of greatest field homogeneity for the polarizing magnetic field $B_0$.

A viewing port 64, to reduce the patient's sense of enclosure, allows the patient 14 to look out of the local coil assembly 8 when the patient's head is positioned within the local coil assembly 8 with the patient's shoulders abutting the inferior end 44 of the local coil assembly 8.

Figure 2:
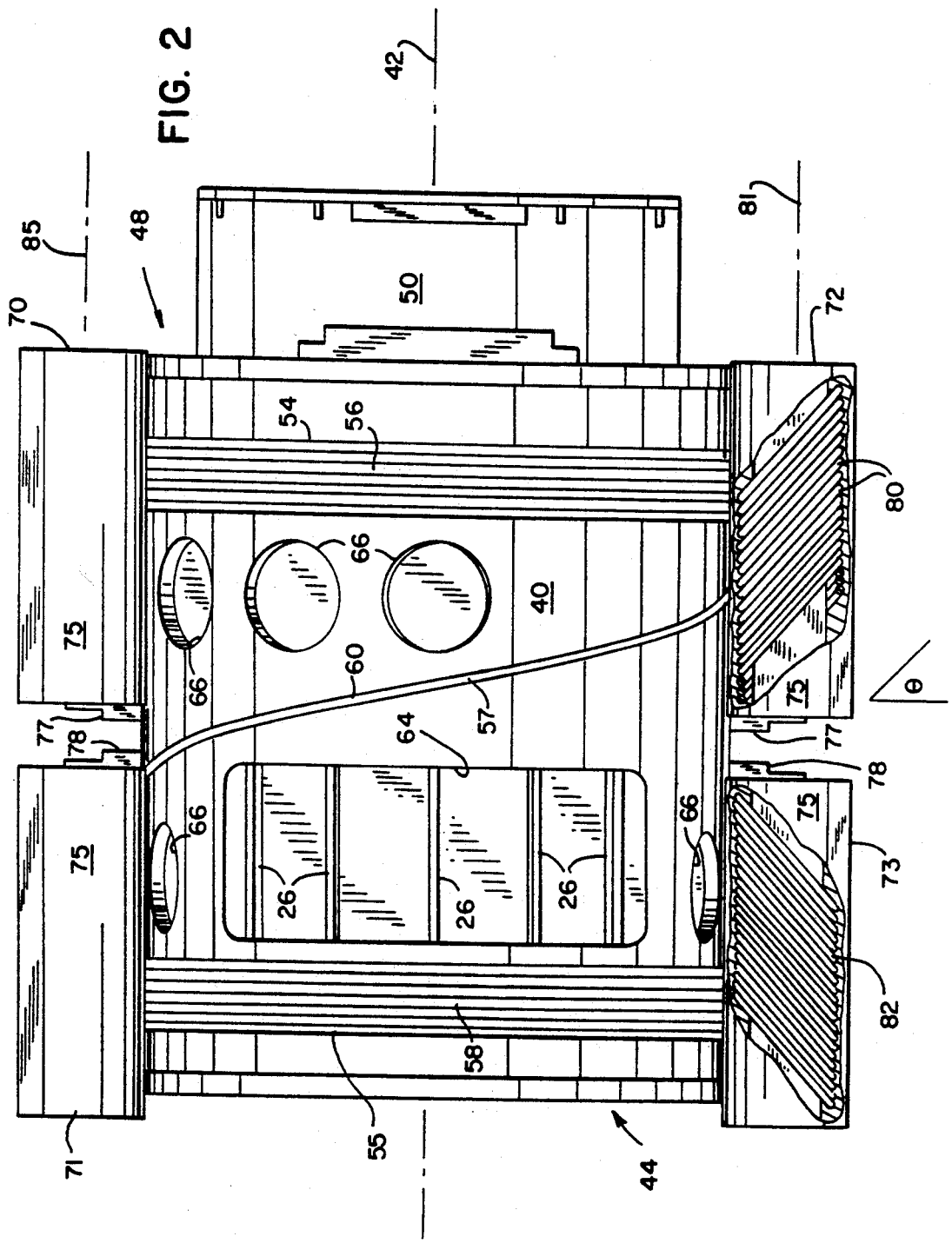
FIG. 2 is a top view with parts cut away of the local gradient coil and RF coil of FIG. 1.
Figure 3:
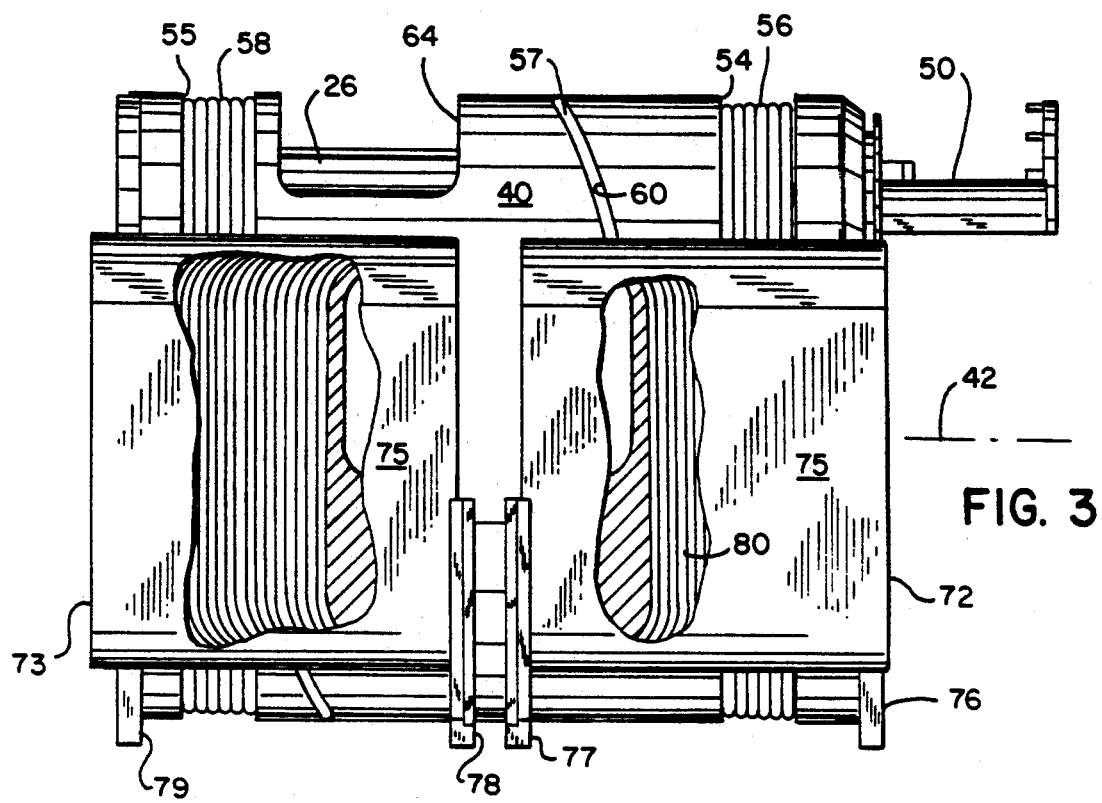
FIG. 3 is a side view in elevation with parts cut away of the local gradient coil and RF coil of FIG. 2.

Referring to FIGS. 2 and 3, the tubular cylindrical form 40 has its axis 42 aligned with the $B_0$ field or z-axis 13 of the MRI magnet 10. The primary form 40 is constructed of a fiberglass tube with a nominal half inch wall thickness, however, it will be recognized that low loss dielectric materials of different dimensions may also be used.

Figure 4:
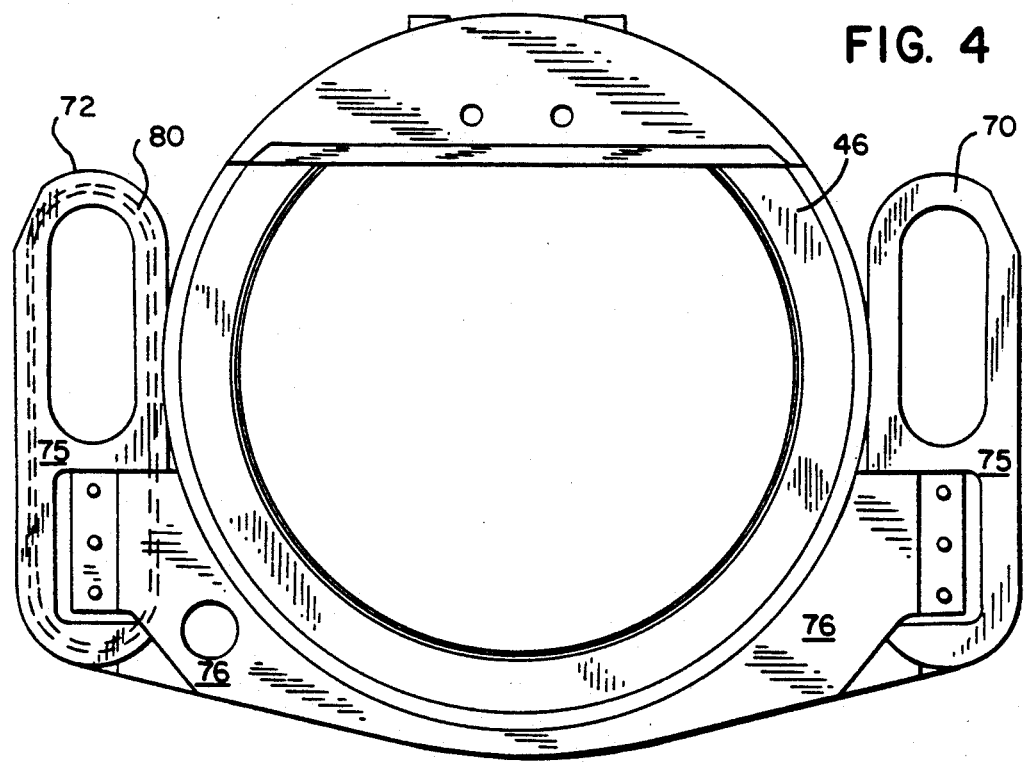
FIG. 4 is an end view in elevation of the local gradient coil and RF coil of FIG. 2.
Figure 5:
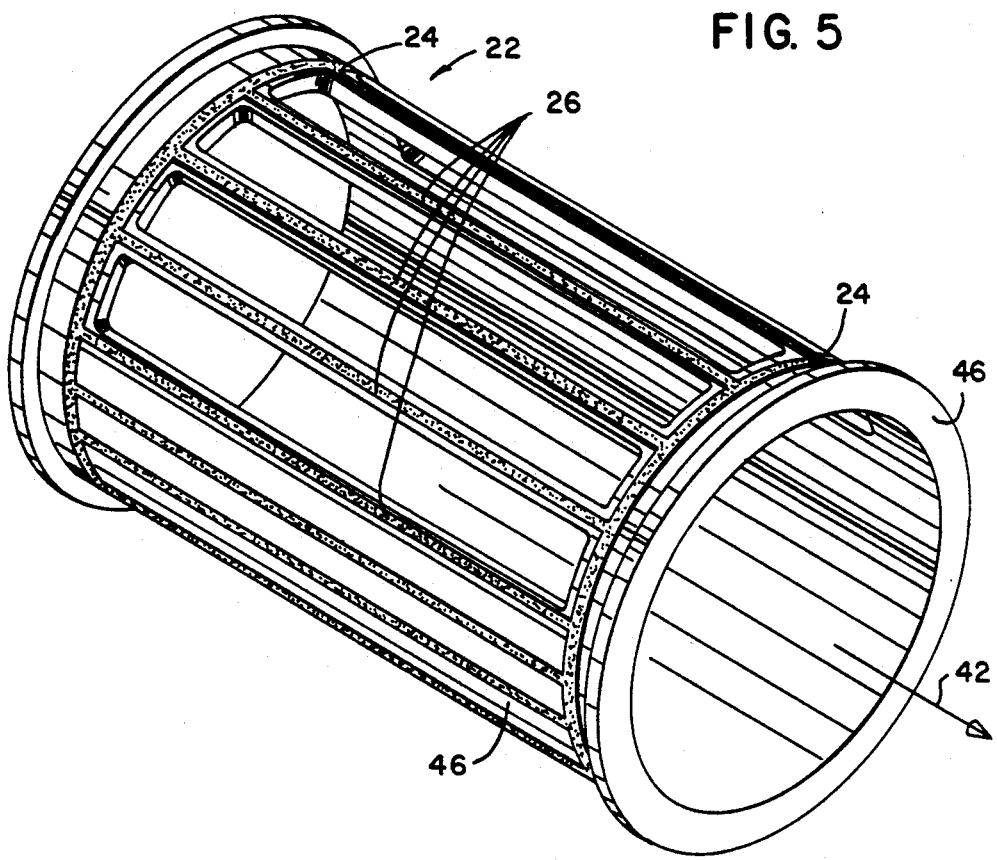
FIG. 5 is a perspective schematic representation of the RF coil of FIGS. 1, 2 and 3.
Figure 6:
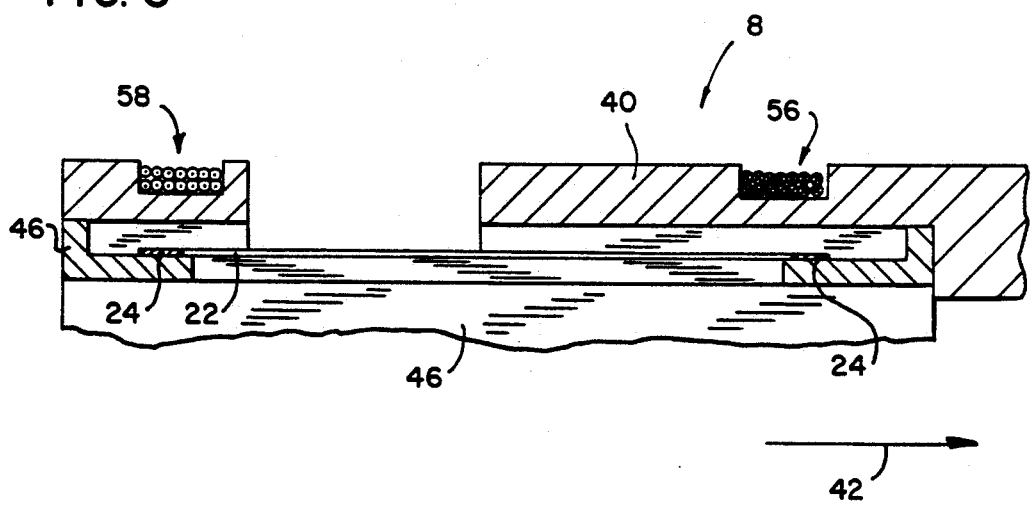
FIG. 6 is a cross-section through the wall of the local gradient coil and RF coil of FIG. 2 showing the relative location of the gradient coils and the direction of current flow through the windings thereof with respect to the RF coil structure.

Referring to FIGS. 2, 4 and 5, a secondary tubular form 46 fits coaxially within the primary form 40 to provide a surface for receiving the head of the patient 18 (shown in FIG. 1) through an inferior end 44 of the primary form 40 and supporting the patient's head on positioning pads or the like (not shown). Conductors for the local RF coil 22 are taped to the outer surface of the secondary tubular form 46 to be encased between the outer surface of the secondary form 46 and the inner surface of the primary form 40. Specifically, the local RF coil 22 is constructed in the form of the well known bird cage coil having conductive end-loops 24 disposed along and centered around the axis 42 and interconnected by a series of sixteen straight conductive segments 26 spaced circumferentially about the end-loops 24. Capacitors formed from insulated overlapping conductors in the segments break the end-loops 24 and/or the conductive segments 26 to form, together with the distributed inductance of the end loops 24, and the conductive segments 26, a resonant structure for producing a rotating RF vector for exciting the nuclear spins in an MRI imaging sequence as has been described. Such coils are taught, for example, in previously cited U.S. Pat. No. 4,680,548.

The portion of the secondary form 46 between the conductive segments 26, not directly beneath the taped segments 26, are cut away on the upper half of the secondary form 46, to not interfere unduly with the patient's view through the viewing port 64.

A superior end 48 of the primary form 40 holds, at its upper rim, an axially extending tab 50 supporting RF connectors for supplying and receiving the quadrature RF signal to and from the RF coil 22, as is understood in the art.

Referring also to FIGS. 2 and 3, the primary form 40 has circumferential channels 54 and 55 cut into its outer surface at both the inferior and superior ends 44 and 48, respectively, to receive conductor 57 forming solenoid coils 58 and 56 of a Maxwell pair for generating the z-axis magnetic field gradient, $G_z$. A helical groove 60 joins these two channels 54 and 55. The conductor 57 of the coils 56 and is wound from the superior edge of the superior channel 54 and proceeds toward the inferior edge of that channel 54 in clockwise manner as viewed from the inferior end 44. The conductor 57 is then laid along the helical groove 60 to the superior side of the inferior channel 55 and is wound in a counterclockwise direction as viewed from the inferior end 44 until the inferior side of the inferior channel 55 is reached. A second layer of conductor 57 is then wound over the top of the first layer of conductor 57 in the same counterclockwise direction in the inferior channel 55 toward the superior side of that channel and then laid to double back in the helical groove 60 to the inferior side of the superior channel 54 continuing clockwise over the previous layer of conductor until the superior side of the superior channel is reached. The conductor 57 in the helical groove 60 is termed the "return" and electrically connects the two coils 56 and 58. The two ends of the conductor 57 at the superior side of the superior channel 54 are attached to the z-axis gradient amplifier (not shown).

Referring again to FIGS. 2 and 3, the generally rectangular viewing port 64 is cut in the upper surface of the primary form 40 between the coils 56 and 58, near coil 58 and is removed from the helical groove 60 to provide a window through which the patient 18 may look when the patient's head is in position within the primary form 40. The viewing port 64 is interrupted by the conductive segments 26 of the RF coil 22, however, these segments 26 are relatively thin and hence do not significantly obstruct the patient's vision.

Energization of the coils 56 and 58 produces strong vector cross-product forces between the local coil assembly 8 and the superconducting coils 28, which under conditions of periodic gradient excitation create audible vibrations. These vibrations may be reduced somewhat by limiting the audio frequency components of the gradient waveforms as taught by U.S. Pat. No. 4,680,545 and incorporated herein by reference. In addition, tuning ports 66 are cut in the body of the primary form 40 to reduce the audible vibrations. The exact placement of the ports 66 is a function of the dimensions, stiffness, and mass distribution of the primary form 40 with its associated windings 56 and 58 and is selected to meet the following objectives: 1) reduction of the total vibrating surface area of the primary form 40, 2) elimination of the anti-nodal points of vibration of primary form 40 at the relevant gradient signal frequencies, and 3) tuning of the primary form 40 away from the dominant frequencies of excitation of the gradient's signal. Desirably, the ports 66 should avoid the windings 56 and 58 and the helical groove 60.

Referring to FIGS. 2-4 to provide a magnetic field gradient in the direction normal to the z-axis 13, a pair of gradient coils are mounted to each side of the primary form 40. More specifically, a first pair of gradient coils 70 and 71 are mounted on one side of the primary form 40 and a second pair of gradient coils 72 and 73 are mounted to the other side. The gradient coils 70-73 are enclosed in plastic housings 75 which are fastened to brackets 76-79 that extend below and cradle the primary form 40. The brackets 76-79 are made of polyvinyl chloride and they are bonded to the primary cylindrical coil form 40.

Referring particularly to FIGS. 2 and 3, each gradient coil 70-73 is comprised of a set of windings that form vertical loops. The loops 80 in the gradient coil 72, for example, are substantially vertical and they are disposed along a horizontal axis 81 which is parallel to the central axis 42. The loops 80 are canted at an angle of 42.53° with respect to a plane perpendicular to the central axis 42 to optimize the linearity of the gradient field as described above for a coil whose length is 0.306 meters, with $r_0 = 0.286$ meters, $\Theta_0 = 57.64°$, and $R = -0.181$ meters, then $\Theta_i = 64.3°$ and $r_i = 0.201$ meters. The dimensions are appropriate for a local head gradient coil. The loops 82 in the gradient coil 73 are identical to the loops 80 in size and number and they are also disposed along the axis 81. The loops 82 are canted at the same angle as the loops 80, but in the opposite direction from the perpendicular plane. The current flows in the same direction in the gradient coil pair 72 and 73 such that the magnetic flux flows through the loops 80 and 82 toward the superior end 48 of the local coil 8.

The gradient coils 70 and 71 are mirror images of the respective gradient coils 72 and 73. The current loops which they form are the same in size and number and they are vertical. The current loops in gradient coils 70 and 71 are disposed along an axis 85 which is parallel to the central axis 40 and they are canted to the same degree from the perpendicular plane. They are connected to conduct current such that the magnetic flux flowing through the gradient coils 70 and 71 is directed towards the inferior end 44 of the local coil 8.

In the preferred embodiment the gradient coils 70-73 are disposed on opposite sides of the coil form 40 and the magnetic field gradient which they produce is directed horizontally. In a typical application these gradient coils would be connected to the output of the x or y gradient amplifiers. The choice is determined by the particular pulse sequence being used and is usually that gradient (x or y) which is switched at the highest rate.

I claim:

1. A coil assembly for use in an NMR system that produces a polarizing magnetic field, which comprises:

a cylindrical form disposed around a central opening and having a central axis aligned with the polarizing magnetic field of the NMR system;

a first pair of gradient coils mounted to one side of the cylindrical form for producing a first magnetic field which is oriented substantially parallel to the polarizing magnetic field within the central opening and is directed in a first direction therealong; and a second pair of gradient coils mounted to a side opposite to said one side of the cylindrical form for producing a second magnetic field which is oriented substantially parallel to the polarizing magnetic field within the central opening and is directed in a second direction therealong which is opposite to the direction of the first magnetic field;

each gradient coil having a set of loops oriented in planes which are tilted from a plane perpendicular to the central axis and the first and second magnetic fields having a gradient perpendicular to the polarizing magnetic field.

2. The coil assembly as recited in claim 1 in which an RF coil is disposed inside said cylindrical form.

3. The coil assembly as recited in claim 1 which includes a third pair of gradient coils wound around the cylindrical form to produce a third magnetic field oriented in the direction of the polarizing magnetic field and said third magnetic field having a gradient in the direction of the polarizing magnetic field.

4. The coil assembly as recited in claim 1 in which the cylindrical form has a viewing port therein for access to a subject disposed in the central opening defined by the cylindrical form.

5. The coil assembly as recited in claim 1 in which opposing gradient coils in the first and second pairs of gradient coils are mounted to the cylindrical form by brackets which fasten to and cradle the cylindrical form.

6. The coil assembly as recited in claim 1 in which the second pair of gradient coils is a mirror image of the first pair of gradient coils.

* * * * *